United States Patent
Martinez, Jr. et al.

[11] Patent Number: 6,154,369
[45] Date of Patent: Nov. 28, 2000

[54] ELECTRONIC ASSEMBLY FOR REMOVING HEAT FROM A SEMICONDUCTOR DEVICE

[75] Inventors: Joe Luis Martinez, Jr., Phoenix; Pablo Rodriguez, Gilbert; Martin Aaron Kalfus, Scottsdale, all of Ariz.

[73] Assignee: Motorola, Inc., Schaumburg, Ill.

[21] Appl. No.: 09/456,489

[22] Filed: Dec. 7, 1999

Related U.S. Application Data

[63] Continuation-in-part of application No. 09/046,279, Mar. 23, 1998, abandoned.

[51] Int. Cl.[7] .................................................... H05K 7/20
[52] U.S. Cl. .......................... 361/719; 174/252; 361/704
[58] Field of Search ..................... 252/706, 713, 252/717; 174/252; 165/80.3, 185; 361/704, 705, 707, 703, 709–713, 717–719

[56] References Cited

U.S. PATENT DOCUMENTS

| | | |
|---|---|---|
| 5,218,516 | 6/1993 | Collins . |
| 5,436,793 | 7/1995 | Sanwo . |
| 5,455,458 | 10/1995 | Quon . |
| 5,475,565 | 12/1995 | Bhattacharyya . |
| 5,504,378 | 4/1996 | Lindberg . |
| 5,513,072 | 4/1996 | Imaji . |
| 5,625,536 | 4/1997 | Soyano . |
| 5,657,203 | 8/1997 | Hirao . |
| 5,666,269 | 9/1997 | Romero . |
| 5,751,552 | 5/1998 | Scanlan . |
| 5,926,373 | 7/1999 | Stevens . |

FOREIGN PATENT DOCUMENTS

| | | | |
|---|---|---|---|
| 2516007 | 11/1975 | Germany | 361/388 |
| 4326506 | 2/1995 | Germany | 361/707 |

*Primary Examiner*—Gerald Tolin
*Attorney, Agent, or Firm*—Anthony M. Martinez; A. Kate Huffman

[57] ABSTRACT

An electronic assembly (20) having an insulated metal heat sink (10) and a method of manufacturing the electronic assembly (20). The electronic assembly (20) has a heat dissipater (11), a dielectric material (12), and a conductive layer (13). A semiconductor chip (21) is attached to the insulated metal heat sink (10). Heat generated by the semiconductor chip (21) is conducted to the conduction surface (14) of the heat dissipater (11). In one embodiment a convection surface (16) of the heat dissipater (11) is present and the heat is transferred from the convection surface (16) of the heat dissipater (11) to a fluid by convection. The fluid is directed by a manifold (64).

9 Claims, 4 Drawing Sheets

ELECTRONIC ASSEMBLY FOR REMOVING HEAT FROM A SEMICONDUCTOR DEVICE

RELATED APPLICATION

This application is a continuation-in-part of U.S. Ser. No. 09/046,279 filed on Mar. 23, 1998, now abandoned.

FIELD OF THE INVENTION

The present invention relates, in general, to electronic assemblies, and more particularly, to electronic assemblies for removing heat from a semiconductor die to increase package reliability.

BACKGROUND OF THE INVENTION

An important design consideration for systems level designers in such areas as industrial power products, automotive power products, electric vehicles, power supplies, etc. is the removal of heat dissipated by the systems' electronic components. Generally, these components consume large amounts of power and generate large amounts of heat. Therefore, they are commonly referred to as power devices. If the heat generated by these devices is not removed, their junction temperatures will exceed a critical level, resulting in damage or destruction of the electronic components, the system, or both. A commonly used approach for removing heat from electronic components is to attach a heat sink to them, which facilitates heat transfer away from the electronic components. Heat sinks may be either air cooled or liquid cooled, wherein heat is transferred, via conduction, from the electronic components to a surface in contact with the air or liquid. The heat is transferred to the air or liquid by means of convection. Subsequently, the air or liquid carries the heat away from the electronic components. However, many of the conventional methods of transferring heat do not lower the operating temperature of the electronic device enough to avoid failure of the electronic components.

Another important design consideration is the size of the electrical system. Generally, it is desirable for electrical systems to be small and light-weight because of space and weight limitations. However, electrical systems comprising power devices are typically constrained by the ability of the electrical system to dissipate heat generated by the power devices. More particularly, power devices require large heat sinks to ensure sufficient removal of heat to maintain power device junction temperatures within a safe operating range. Thus, electrical systems having power devices often include large, heavy, structures for removing heat, i.e., large heat sinks. These large heat sinks increase the size and weight of the electrical systems.

Accordingly, it would be advantageous to have an electronic assembly for removing heat from a semiconductor die. It would be of further advantage for the electronic assembly to be capable of reducing electrical system size, while maintaining junction temperatures within their safe operating range. It would also be an improvement to provide a method of assembling an electronic assembly which eliminates coupling process steps, such as soldering, adhering, etc. to require fewer steps and equipment to manufacture.

Figure 1:
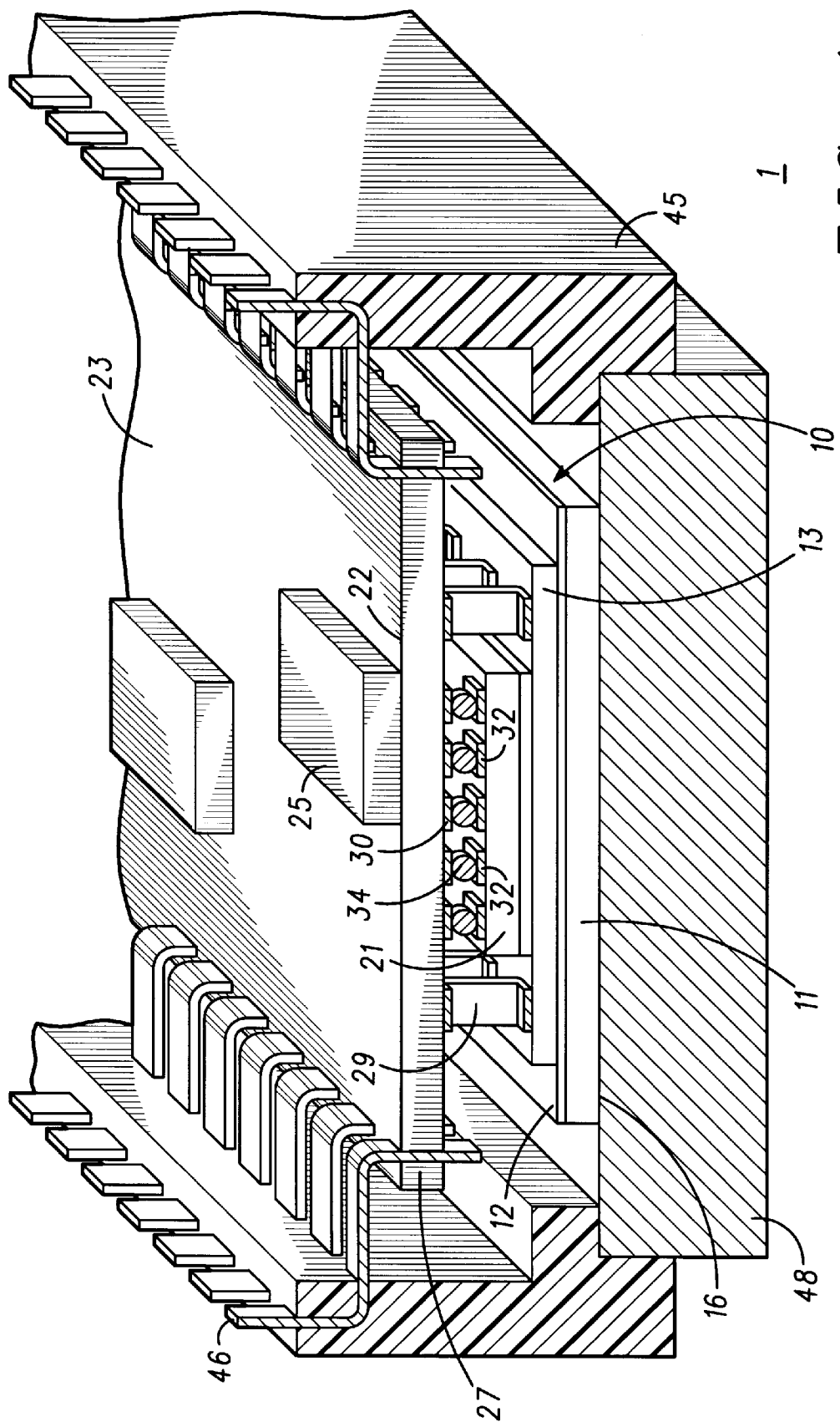
FIG. 1 is a cross-sectional view of a power module assembly in accordance with the present invention.

For simplicity and clarity of illustration, the drawing figures illustrate the general manner of construction, and elements in the drawing figures are not necessarily drawn to scale. Additionally, the same reference numerals in different figures denote the same elements, and descriptions and details of well-known features and techniques are omitted to avoid unnecessarily obscuring the present invention. Furthermore, the terms left, right, front, back, top, bottom, over, under, and the like in the description and in the claims, if any, are used for descriptive purposes. However, it is understood that the embodiment of the invention described herein is capable of operation in other orientations than described or illustrated herein. It is further understood that the terms so used are for the purposes of describing relative positions and are interchangeable under appropriate circumstances.

DETAILED DESCRIPTION OF PREFERRED EMBODIMENTS

Generally, the present invention provides an electronic assembly and a method for manufacturing the electronic assembly. In accordance with the present invention, the electronic assembly includes an insulated metal heat sink having semiconductor devices mounted thereon. A substrate, such as a printed circuit board, is mounted onto the semiconductor device. The insulated metal heat sink includes a heat dissipater having a conduction surface and a convection surface for removing heat generated by the semiconductor devices. The heat is conducted from the semiconductor devices to the conduction surface and through the heat dissipater to the convection surface. The heat is transferred from the convection surface to an ambient medium by means of convection.

Figure 2A:
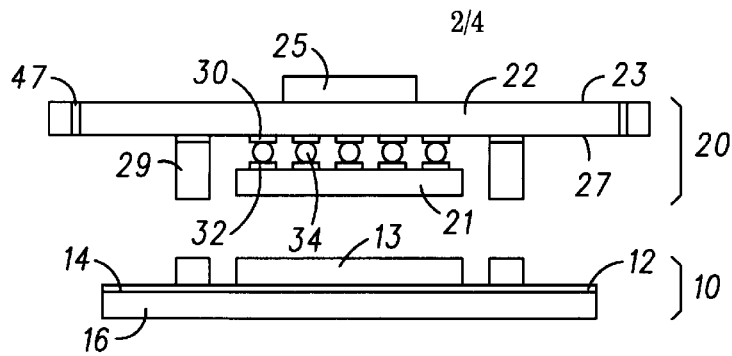
FIGS. 2A–C are schematic cross-sectional views of the process of assembling the power module assembly illustrated in FIG. 1.

FIG. 1 is a cross-sectional view of a power module assembly in accordance with an embodiment of the present invention. Referring to FIG. 2A, an insulated metal heat sink 10 is comprised of a heat dissipater 11 having a conduction surface 14 and a surface 16 which can be either a convection surface or conduction surface. Surface 16 may be of any shape known in the art as illustrated in FIG. 1 and in FIG. 4. Suitable materials for heat dissipater 11 include zinc, aluminum, copper, steel, copper alloys, aluminum alloys, or the like. Techniques for manufacturing a heat dissipater 11 include machining, extruding, bonding, casting, stamping, molding, or the like. Preferably, conduction surface 14 is covered with dielectric material 12 that in turn is covered with electrically conductive layer 13. In other words, electrically conductive layer 13 is dielectrically coupled to conduction surface 14 by dielectric material 12. By way of example, dielectric material 12 is rolled onto surface 14 as a sheet and electrically conductive layer 13 is rolled onto dielectric material 12. Then, heat dissipater 11, dielectric material 12, and electrically conductive layer 13 are laminated together at an elevated temperature. Other techniques for forming dielectric material 12 on surface 14 include depositing, flame-spraying, screen printing, or the like. Suitable techniques for applying electrically conductive layer 13 include flame-spraying, laminating, bonding, soldering, etc.

Materials for dielectric material 12 include B-staged epoxies, filled epoxies, such as ceramic filled epoxies and diamond filled epoxies, ceramics, or other materials capable of providing electrical isolation while maintaining thermal conductivity.

Still referring to FIG. 2A, electrically conductive layer 13 is preferably patterned using conventional etching techniques to form electrical paths, wirebond land areas, semiconductor attach areas, etc. Other techniques for patterning electrically conductive layer 13 to form a patterned layer include screen printing, patterning during the step of flame-spraying, or bonding a stamped metal circuit to dielectric material 12.

Materials for electrically conductive layer 13 include electrically conductive metals such as, for example, copper, aluminum, brass, silver, or the like. In addition, electrically conductive layer 13 can be formed from conductive inks.

A subassembly 20 comprises a substrate 22 having discretes 25 attached to one side 23 and the substrate 22 is coupled to a semiconductor chip 21 by any conventional means, but preferably by means of solder bumps or mounds 34. Preferably, the substrate 22 is a printed circuit board, a circuitized ceramic packaging substrate, a circuitized metal packaging substrate, a circuitized glass packaging substrate, a circuitized semiconductor substrate and the like. The substrate 22 has a first side 23 having any conventional number and kind of discretes 25 disposed thereon that are typically used in the industry, including smart chips, etc. A second side 27 of the substrate 22 preferably contains electrically conductive pads 29 for routing high current paths from the semiconductor device 21 to the substrate 22. The presence of the electrically conductive pads 29 and solder bumps or mounds 34 eliminates the need for electrical connectors such as wire bonds that may fail because of fatigue of the materials.

Also positioned on the second side 27 of the substrate 22 are a plurality of electrical contact pads 30 and on the semiconductor device 21 a plurality of electrical contact pads 32 are disposed in a similar location. Between the contact pads 30 and 32 there is disposed an electrical interconnection means which are preferably solder mounds or bumps 34 which are soldered to the contact pads 30 and 32.

The substrate 22 also contains one or more electrical interconnects 47 to complete a connection to an outside electrical source. In a preferred embodiment the interconnects 47 are channels, trenches, through vias, etc. which may be press fitted onto metal inserts 46 that serve as electrical interconnects to complete the circuit.

Power module assembly 1 includes an insulated metal heat sink 10 having heat generating components such as, for example, a semiconductor chip 21 and the subassembly 20, mounted thereon. More particularly, semiconductor chip 21 is mounted on the conductive layer 13. Techniques for mounting semiconductor chip 21 to conductive layer 13 include soldering, adhesively bonding, etc.

The subassembly 20 is subsequently mounted onto the heat sink 10 by any conventional means such as soldering, adhesively bonding, etc. In the preferred embodiment the subassembly 20 is soldered into position using solder mounds or bumps 34, as described above.

A housing 45 is used to enclose the power module assembly 1. Preferably, housing 45 is a metal insert molded plastic housing, wherein metal inserts 46 serve as the electrical interconnects, such as leads. In the preferred embodiment the electrical interconnects are press fitted into receiving channels or vias 47 in the substrate 22. Other convention means known in the art may also be used to connect the housing 45 and subassembly 20, such as, for example, an adhesive material (not shown), such as a silicone based adhesive.

Semiconductor chip 21 is electrically coupled to the electrically conductive layer 13 and to electrical interconnects 47. Although, the electrical interconnects may be wirebonds, electrical clips, metal strips, etc. in the preferred embodiment the electrical interconnects are metal strips molded into the housing 45 as illustrated in FIG. 1. Using electrical interconnects eliminates a coupling, particularly soldering step in the manufacturing process that is required when electrical clips must be attached to the substrate 22. It should be noted that only a single chip 21 is shown for purposes of illustration and that a plurality of chips may be mounted on conductive layer 13. In a preferred embodiment as illustrated in FIG. 1 a heat sink 48 may be attached to one side on the insulated metal heat sink 10 thus using surface 16 as a conduction surface to further reduce the high operating junction temperatures of the semiconductor chip 21 and the discrete 25. If no heat sink 48 is attached, surface 16 will be a convection surface to convect heat away from insulated metal heat sink 10.

Figure 3:
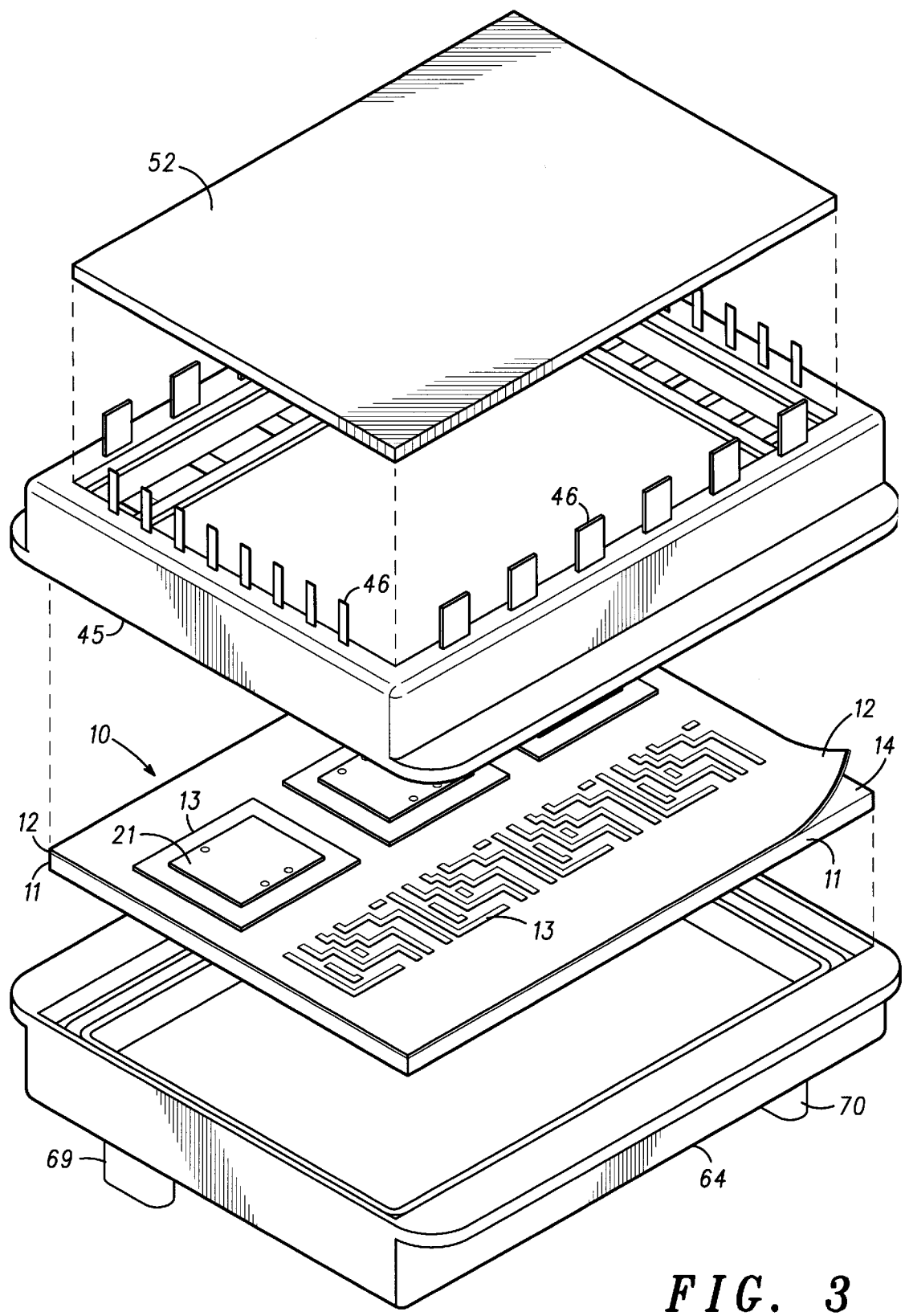
FIG. 3. is an exploded isometric view of a second power module assembly in accordance with the present invention.

FIG. 3 shows a second power module assembly 40 (FIG. 5) which includes a second insulated metal heat sink 10 (FIG. 3) having heat generating components such as, for example, a semiconductor chip 21 and the subassembly 20, mounted thereon. More particularly, semiconductor chip 21 is mounted on the conductive layer 13. Techniques for mounting semiconductor chip 21 to conductive layer 13 include soldering adhesively bonding, etc.

A second housing 45 is used to enclose the power module assembly 40. Preferably, housing 45 is a metal insert molded plastic housing, wherein metal inserts 46 serve as the electrical interconnects, such as leads. In the illustrated embodiment the electrical interconnects are connected to chip 21 via wire bond 26.

Semiconductor chip 21 is electrically coupled to the electrically conductive layer 13 and to electrical interconnects 47. In the example shown, the electrical interconnects are wirebonds and may be electrical clips, metal strips, etc. in the preferred embodiment the electrical interconnects are metal strips molded into the housing 45 as illustrated in FIG. 1.

Figure 5:
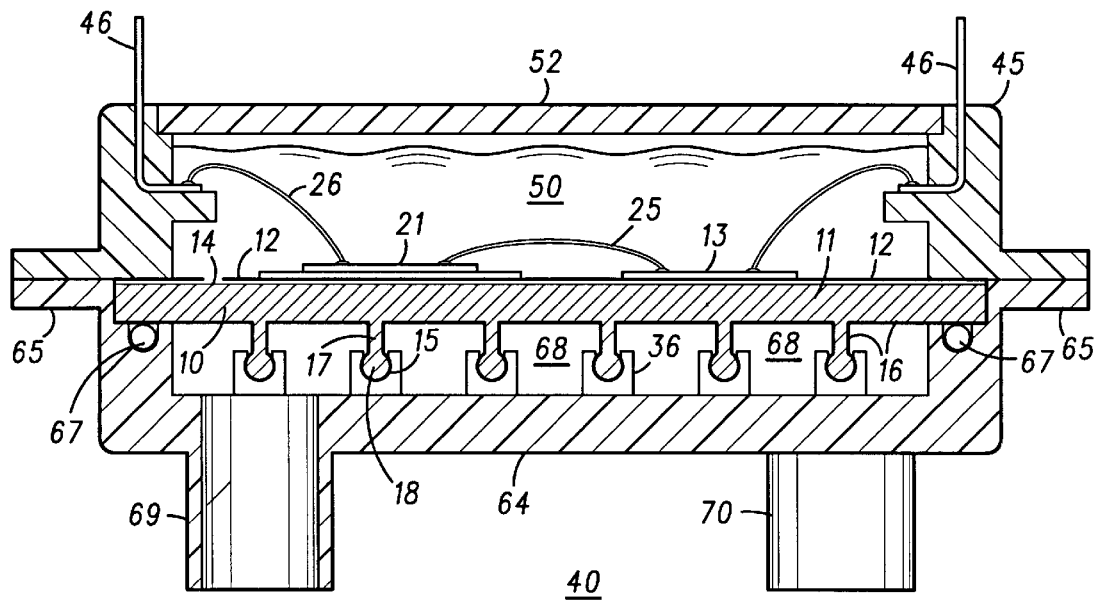
FIG. 5 is a cross-sectional view of the power module assembly of FIG. 3 having the insulated metal heat sink second embodiment illustrated in FIG. 4.

It should be noted that only a single chip 21 is shown for purposes of illustration and that a plurality of chips may be mounted on conductive layer 13. In the illustrated embodiment as illustrated in FIG. 5, the heat sink can be integrated within heatsink 10 to convect the heat to a liquid.

The semiconductor chip 21, electrically conductive layer 13, and portions of electrically conductive layer 13 may be covered with a dielectric material such as, for example, a potting compound 50. Examples of potting compounds include silicone, epoxy, or the like. Potting compound 50 prevents electrical arcing and prevents contaminants from damaging semiconductor chip 21. Although potting compound 50 is shown as partially filling a cavity formed by housing 45, this is not a limitation of the present invention. Preferably, potting compound 50 covers semiconductor chip 21 and a portion of the subassembly 20.

A module cover 52 is coupled to housing 45. The module cover 52 can be adhesively attached or ultrasonically staked to the housing 45.

Power module assembly 40 includes a fluid manifold 64 that enables power module assembly 40 to be cooled by a fluid, thereby enabling higher heat removal. Fluid manifold 64 has a lip or mating feature 65 for mating with housing 45 and securing fluid manifold 64 to power module assembly 40. Additionally, fluid manifold 64 includes a sealing feature 67 for preventing fluid leakage from flow channels 68. Suitable sealing features include gaskets, O-rings, ultrasonic staking, silicone adhesives, etc. Fluid manifold 64 includes a fluid inlet port 69 and a fluid outlet port 70. Fluid inlet port 69 is preferably offset from fluid outlet port 70 to enhance fluid turbulence, hence increasing convective heat transfer from convection surface 16 to the fluid in channels 38. In addition, fluid manifold 64 cooperates with insulated metal heat sink 10 to form flow channels 68 through which fluid can flow. Although fluid manifold 64 is shown as having a plurality of fasteners, this is not a limitation of the present invention. Fluid manifold 64 can be manufactured without fasteners.

Fluid manifold 64 can include perturbators (not shown) to enhance fluid turbulence, hence increasing convective heat transfer. It should be understood that fluid manifold 64 is an optional feature that increases convective heat transfer. Suitable materials for fluid manifold 64 include plastic, metal, ceramics, or the like.

FIG. 3 is an exploded isometric view of power module assembly 40 of FIG. 5, and is provided to further illustrate power module assembly 40. As described hereinbefore, power module assembly 40 includes a second insulated metal heat sink 10 coupled to housing 45. Module cover 52 is attached to housing 45 and fluid manifold 64 is coupled to housing 45. Potting compound 50 is not shown in FIG. 2 for purposes of clarity.

FIG. 3 illustrates a second preferred embodiment of the invention in that the insulated metal heat sink 10 has fins 15 that are composed of a thermally conductive material. It should be understood that the shape of the fins is not a limitation of the present invention. For example, the fins can be pin fins, round pin fins, diamond-shaped fins, square-shaped fins, tapered fins, long continuous fins or segmented fins. Although the heat dissipater 11 is described as having fins, this is not a limitation of the present invention. Any technique for increasing the surface area of heat dissipater 11 while minimizing the distance between conduction surface 14 and convection surface 16 can be used to form heat dissipater 11.

In a preferred embodiment, fins 15 include a proximal portion 17 and a distal portion 18, wherein a diameter of proximal portion 17 is less than a diameter of distal portion 18. In this embodiment, the shape of proximal portion 17 is rectangular and the shape of distal portion 18 is spherical for coupling fins 15 to fluid manifold 64 via fasteners 36.

Figure 4:
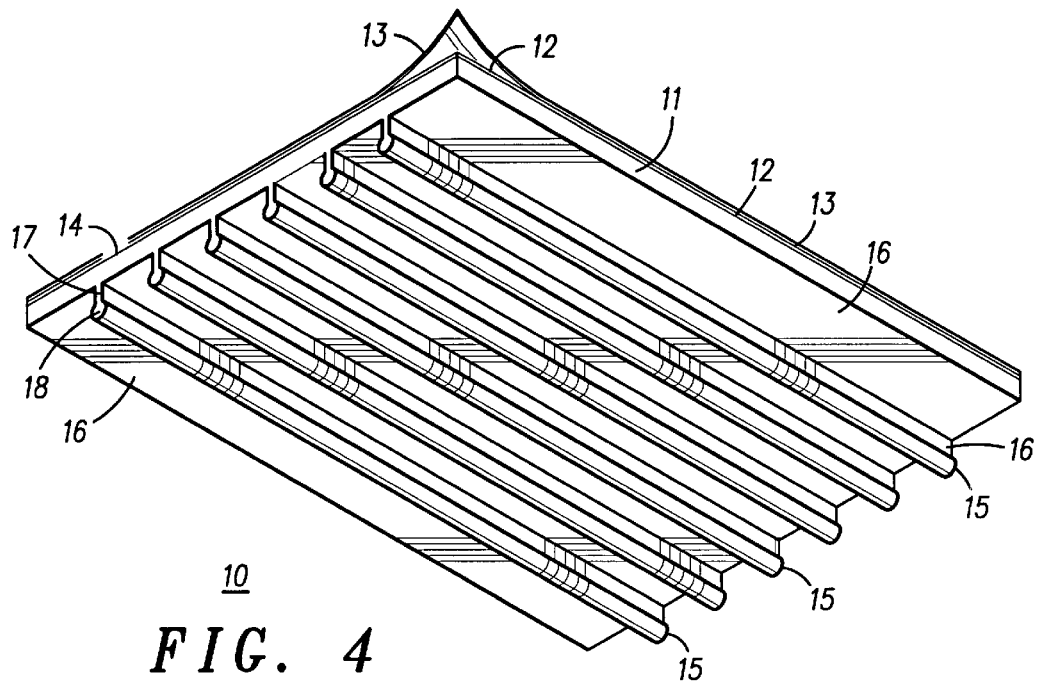
FIG. 4 is an isometric view of a second embodiment of an insulated metal heat sink in accordance with the present invention.

FIG. 4 illustrates a power module assembly 40 having an insulated metal heat sink 10 with fins 15. In this embodiment, the fluid manifold 64 includes fastening features or fasteners 72 which cooperate with the fins 15 to prevent expansion of fluid manifold 64, limiting stresses and deflections on fluid manifold 64.

Figure 2B:
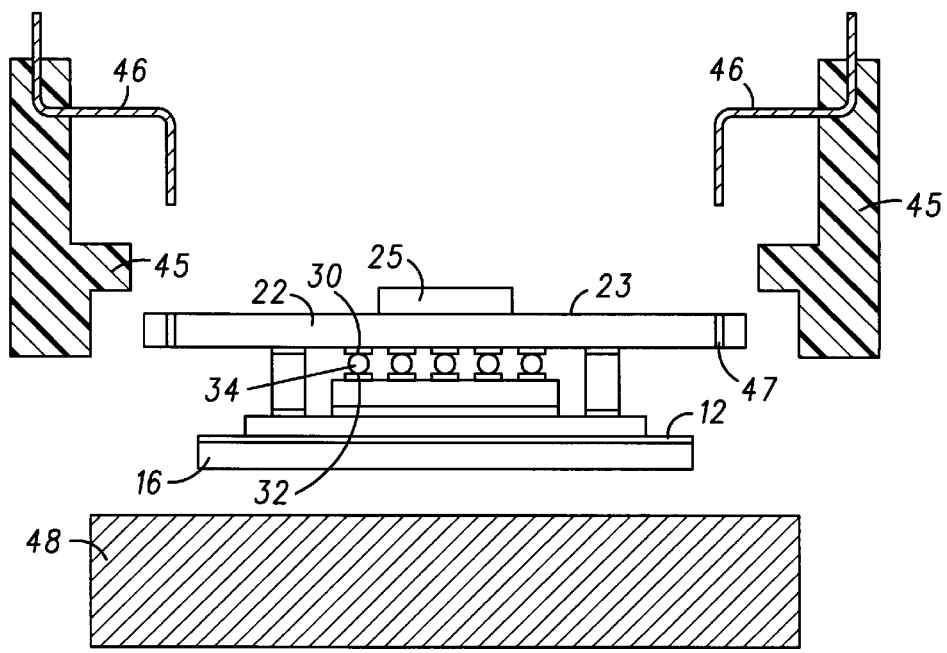
Figure 2C:
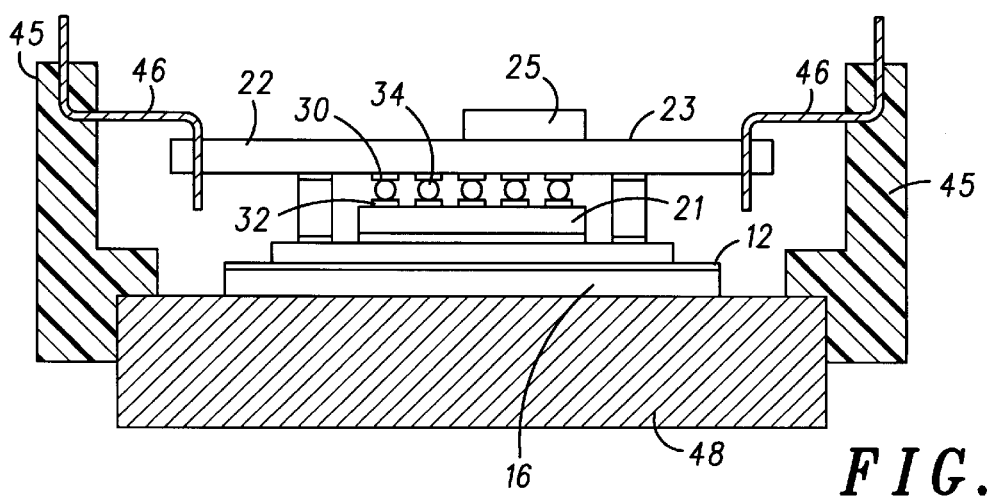

The process of manufacturing the device of the invention is illustrated in FIGS. 2A–C. In particular the subassembly 20 is coupled to the insulated metal heat sink 10 as illustrated in FIG. 2A. In the preferred embodiment solder paste is used to couple these components. The housing 45 with its electrical interconnects 46 is attached to the first side 23 of the substrate 22 by any conventional means. In the preferred embodiment, the electrical interconnects 46 are metal leads that are press fitted into receiving channels 47, such as through vias, trenches, etc. If a heat sink is to be added to the device it is attached to a side of the insulated metal heat sink 10 by compression using thermal grease or a similar adhesive. In the preferred process only one soldering step is used to assemble the components, thereby simplifying eliminating equipment needed to manufacture the assembly and simplifying the process.

By now it should be appreciated that an electronic assembly has been provided that offers improved thermal performance. A benefit of the present invention is a reduction in the number of interfaces between the semiconductor chip and the ambient medium. Accordingly, fewer components are used, thereby improving reliability and decreasing the cost of the electronic assembly.

Furthermore, while the present invention has been particularly shown and described with reference to specific embodiments, it will be understood by those skilled in the art that various changes may be made to the embodiments herein without departing from the spirit or scope of the present invention. For instance, the numerous details set forth herein such as, for example, the material compositions and the dimensions are provided to facilitate the understanding of the present invention and are not provided to limit the scope of the present invention.

The disclosure of the embodiments of the present invention is intended to be illustrative of the scope of the present invention and is not intended to be limiting. It is intended that the scope of the present invention shall be limited only to the extent required by the appended claims and the rules and principles of applicable law.

What is claimed is:

1. An electronic assembly comprising:
    an insulated metal heat sink comprising
        a heat dissipater having a conduction surface and a convection surface, the convection surface having a plurality of fins to increase surface area of the convection surface;
        a dielectric material disposed over the heat dissipater;
        a heat generating component disposed on the dielectric material;
    a substrate coupled to the dielectric material;
    an electrically conductive layer connecting the heat dissipater and the substrate;
    a fluid manifold located on the heat dissipater: and
    a housing having an electrical interconnect coupled to the substrate to contain the electronic assembly.

2. The electronic assembly of claim 1, further including a module cover on to the housing.

3. The electronic assembly of claim 1, wherein the fluid manifold has a plurality of ports.

4. The electronic assembly of claim 1, wherein a material for the fluid manifold is selected from the group consisting of plastic, metal, and ceramic.

5. The electronic assembly of claim 1, wherein the fluid manifold includes at least one fastener.

6. The electronic assembly of claim 1, further including an O-ring between the fluid manifold and the heat dissipater.

7. The electronic assembly of claim 1, further including a potting compound, wherein the potting compound is within the housing.

8. The electronic assembly of claim 1, wherein the heat generating component is a semiconductor chip.

9. The electronic assembly of claim 1 wherein the substrate is selected from the group consisting of a printed circuit board, a circuitized ceramic packaging substrate, a circuitized metal packaging substrate, a circuitized glass packaging substrate, a circuitized semiconductor substrate and combinations thereof.

\* \* \* \* \*

UNITED STATES PATENT AND TRADEMARK OFFICE
CERTIFICATE OF CORRECTION

PATENT NO. : 6,154,369                                                                       Page 1 of 1
DATED : November 28, 2000
INVENTOR(S) : Joe Luis Martinez Jr. et al.

It is certified that error appears in the above-identified patent and that said Letters Patent is hereby corrected as shown below:

<u>Title page,</u>
Delete inventors "Pablo Rodriguez and Martin Aaron Kalfus" and add inventor -- Robert E. Rutter --

Signed and Sealed this

Ninth Day of April, 2002

Attest:

*Attesting Officer*

JAMES E. ROGAN
*Director of the United States Patent and Trademark Office*